United States Patent [19]

Herman et al.

[11] 4,412,242
[45] Oct. 25, 1983

[54] PLANAR STRUCTURE FOR HIGH VOLTAGE SEMICONDUCTOR DEVICES WITH GAPS IN GLASSY LAYER OVER HIGH FIELD REGIONS

[75] Inventors: Thomas Herman, Redondo Beach; Alexander Lidow, Manhattan Beach, both of Calif.

[73] Assignee: International Rectifier Corporation, Los Angeles, Calif.

[21] Appl. No.: 207,123

[22] Filed: Nov. 17, 1980

[51] Int. Cl.³ ............................................. H01L 29/34
[52] U.S. Cl. ........................................ 357/52; 357/53; 357/54; 357/73
[58] Field of Search .................... 357/73, 52, 53, 54

[56] References Cited

U.S. PATENT DOCUMENTS

| | | | |
|---|---|---|---|
| 3,309,245 | 3/1967 | Haenichen | 357/52 |
| 3,489,953 | 1/1970 | Thomas | 357/53 |
| 3,492,174 | 1/1970 | Nakamura et al. | 357/52 |
| 3,497,407 | 2/1970 | Esch et al. | 357/73 |
| 3,506,502 | 4/1970 | Nakamura et al. | 357/52 |
| 3,518,494 | 6/1970 | James | 357/54 |
| 3,632,433 | 1/1972 | Tokuyama et al. | 357/73 |
| 3,649,886 | 3/1972 | Kooi | 357/52 |
| 3,821,779 | 6/1974 | Usuda | 357/52 |
| 4,148,053 | 4/1979 | Bosselaar et al. | 357/53 |

FOREIGN PATENT DOCUMENTS

| | | | |
|---|---|---|---|
| 667423 | 7/1963 | Canada | 357/52 |
| 1137140 | 9/1962 | Fed. Rep. of Germany | 357/52 |
| 2510922 | 9/1976 | Fed. Rep. of Germany | 357/53 |
| 2840975 | 4/1979 | Fed. Rep. of Germany | 357/73 |
| 47-43025 | 10/1972 | Japan | 357/73 |

OTHER PUBLICATIONS

Electronic News, May 31, 1965, Texas Instruments Ad.
B. Sunners et al., "Control of Silicon–Glass Interface Potential," IBM Tech. Discl. Bull., vol. 8 #7, Dec. 1965, p. 1012.
M. Schlacter et al., "Adv. of Vapor-Plated PS Films in Large Scale IC Arrays, " IEEE Trans. on Elec. Dev., vol. ED-17 #12, Dec. 1970, pp. 1077–1083.
D. Woo et al., "Silicon Nitride Iso. of PSG Layer," RCA Tech. Notes, #1234, Nov. 27, 1979, two pages.

*Primary Examiner*—Joseph E. Clawson, Jr.
*Attorney, Agent, or Firm*—Ostrolenk, Faber, Gerb & Soffen

[57] ABSTRACT

Two gaps are placed in the reflowed phosphorus-doped silicon dioxide material overcoating of a planar high voltage semiconductor device to prevent polarization of the reflowed silox. The invention is applicable to any device using a polarizable glassy coating which will be exposed to a high electric field extending along its surface and is shown applied to a high voltage diode, a high voltage MOSFET and a high voltage TRIMOS-type device which is a semiconductor switching device using spaced MOS transistors having a common drain region.

15 Claims, 19 Drawing Figures

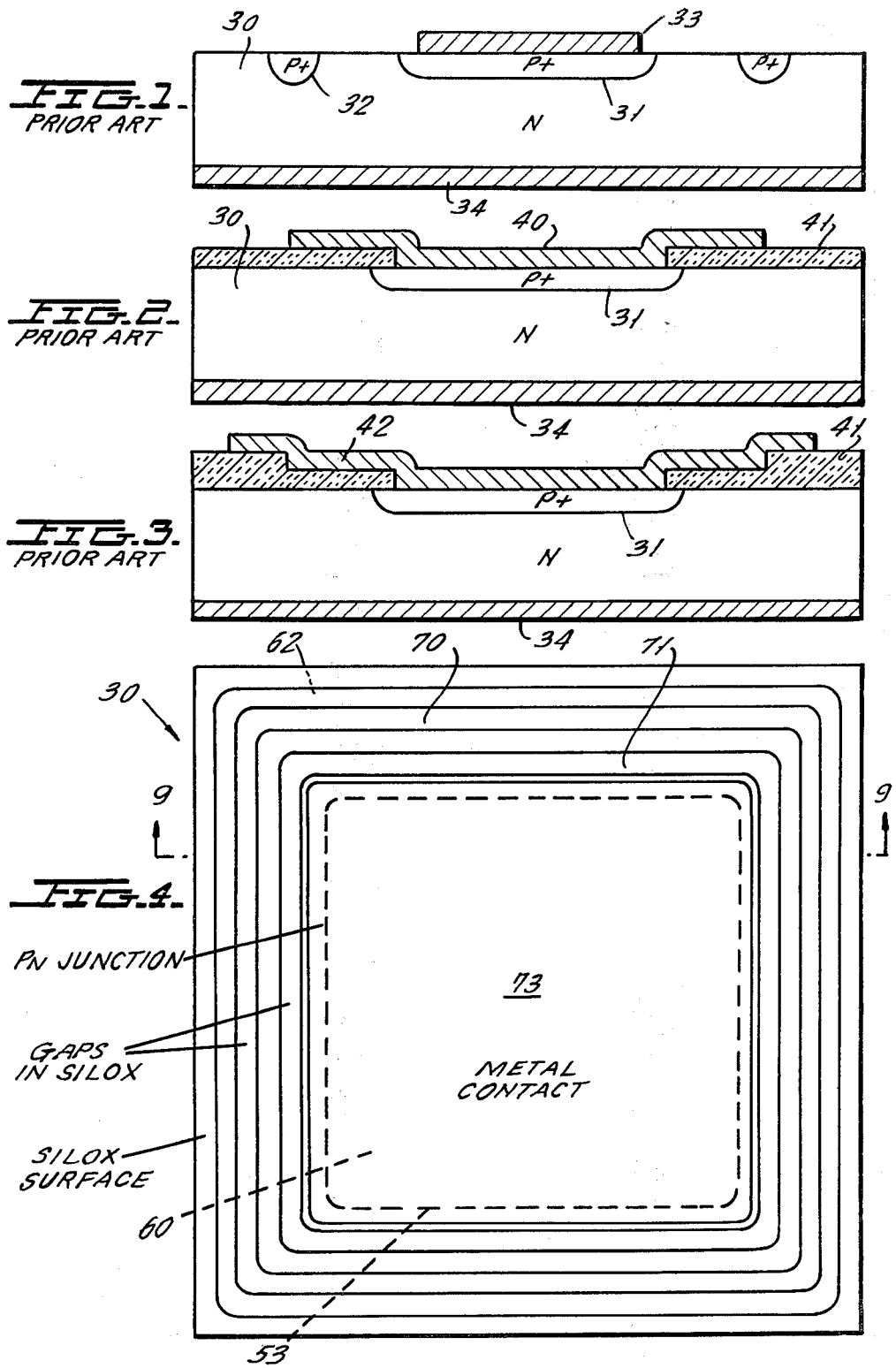

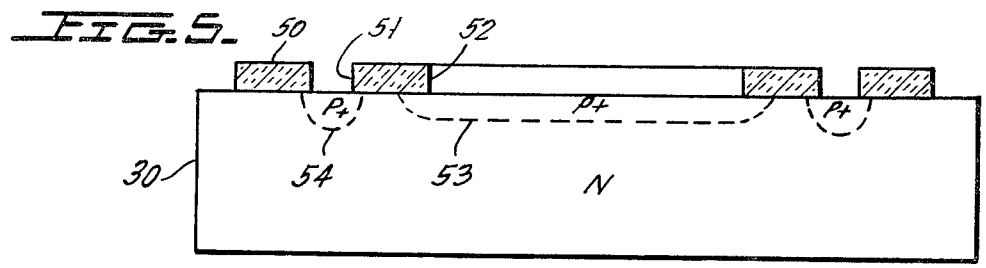
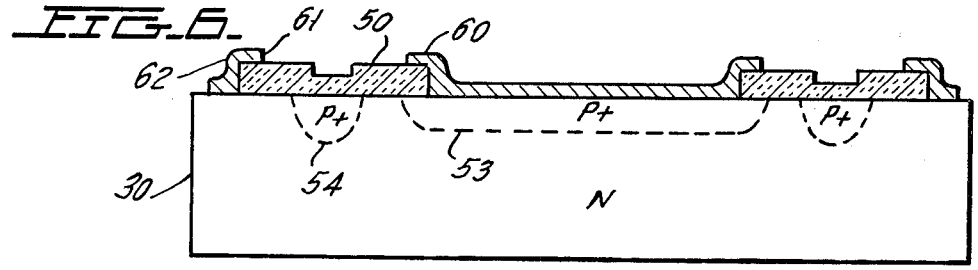
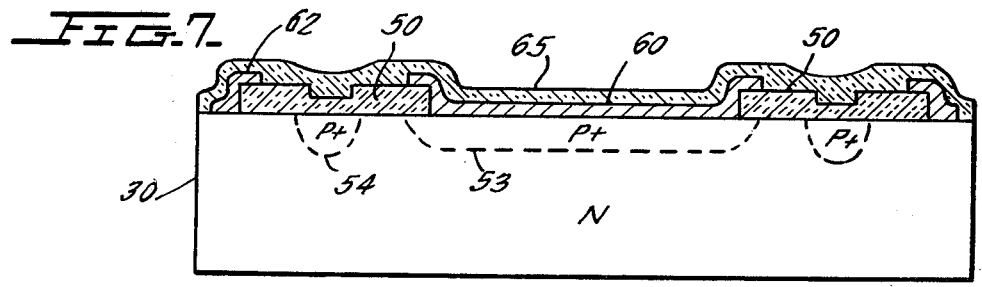
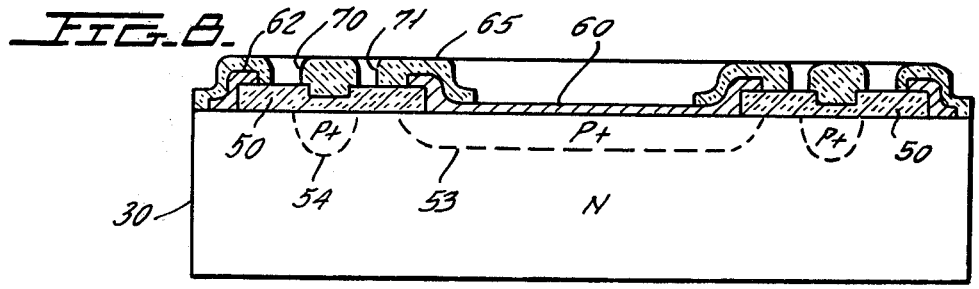
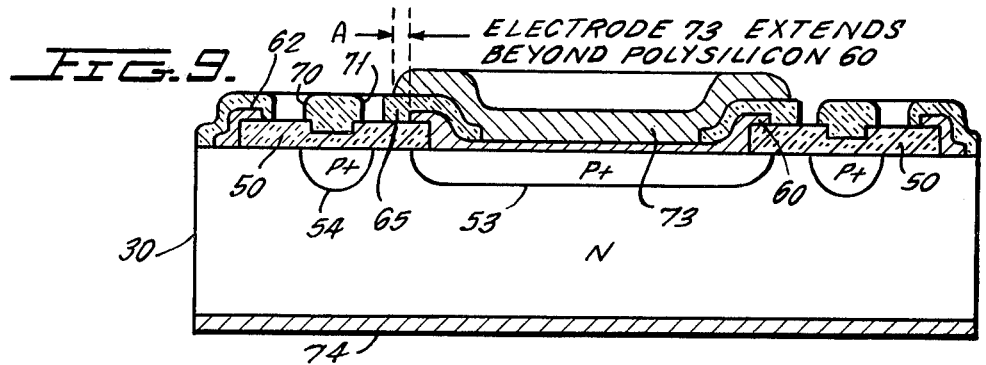

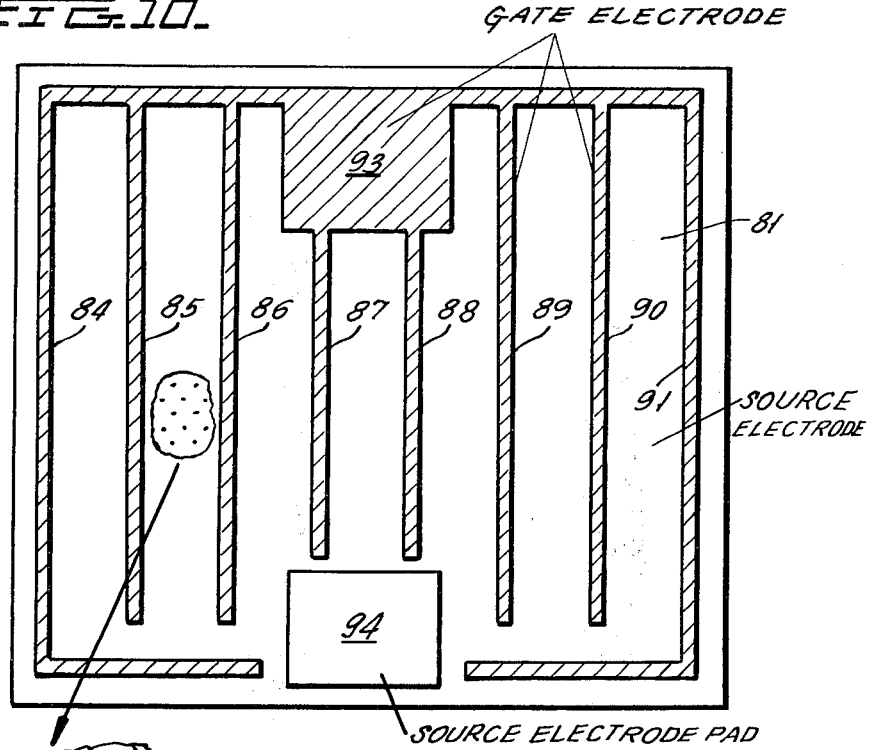
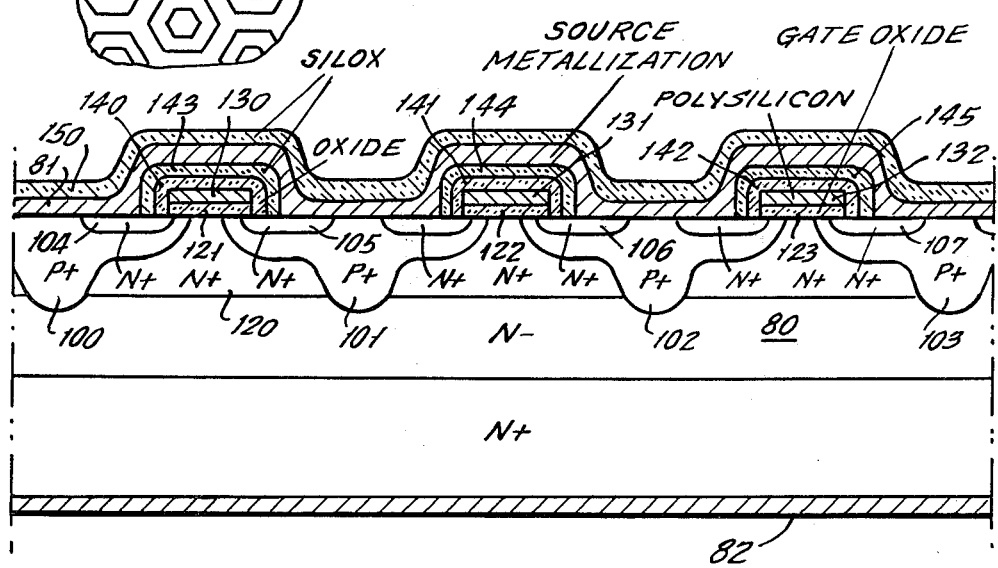

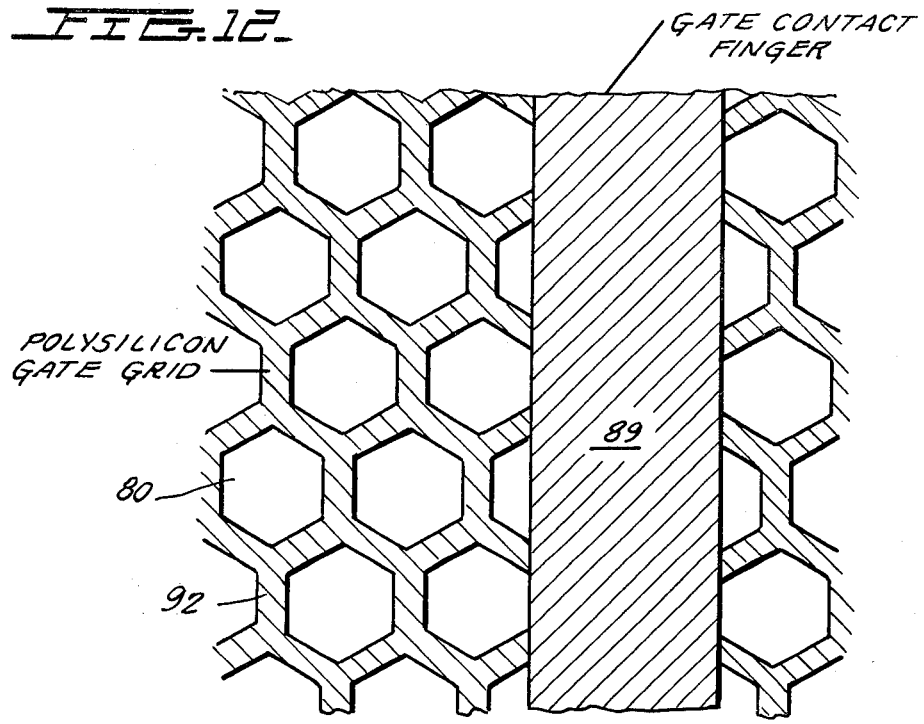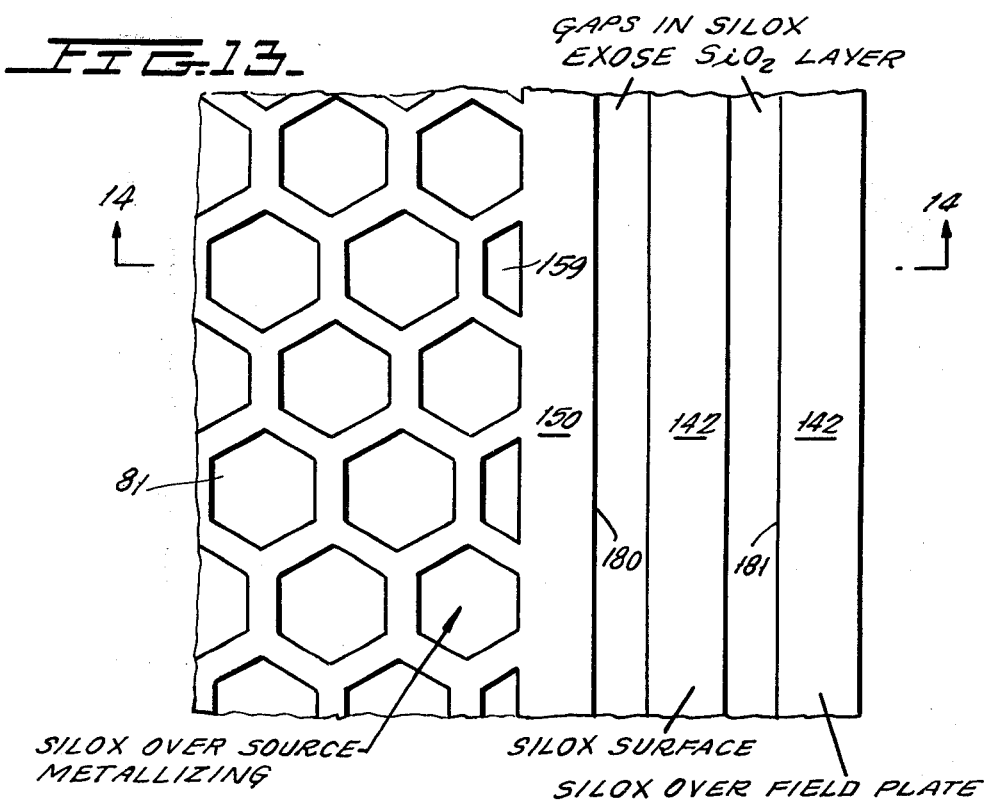

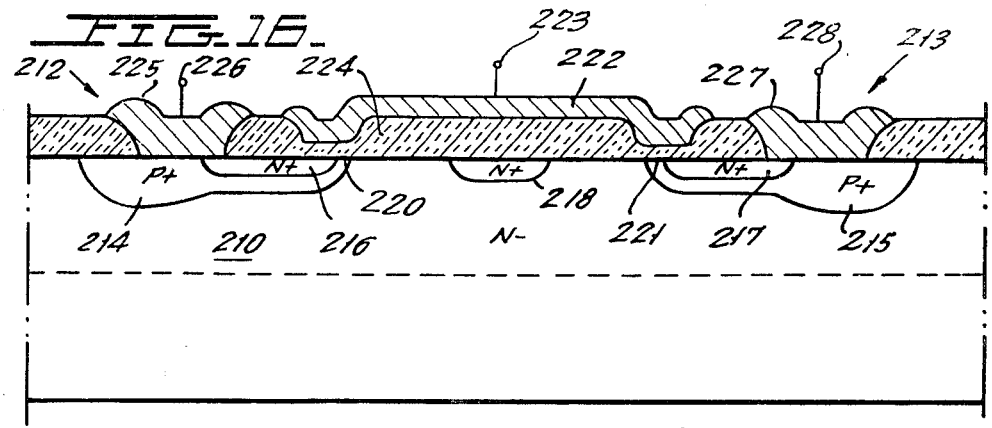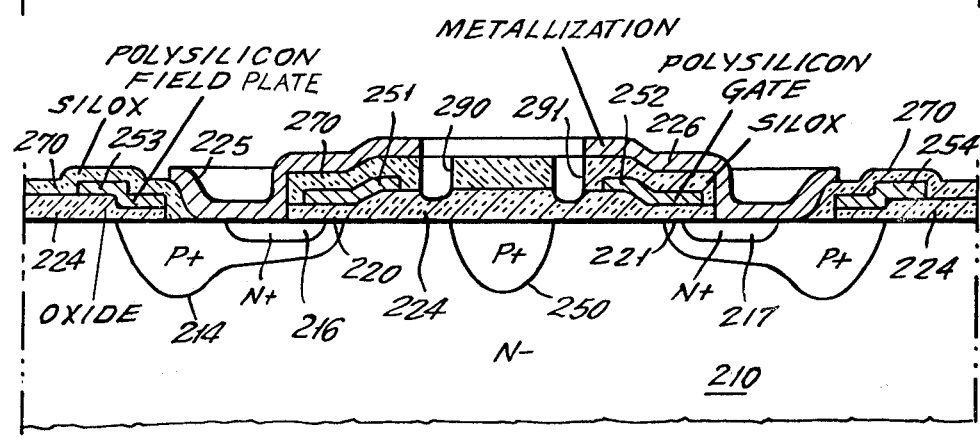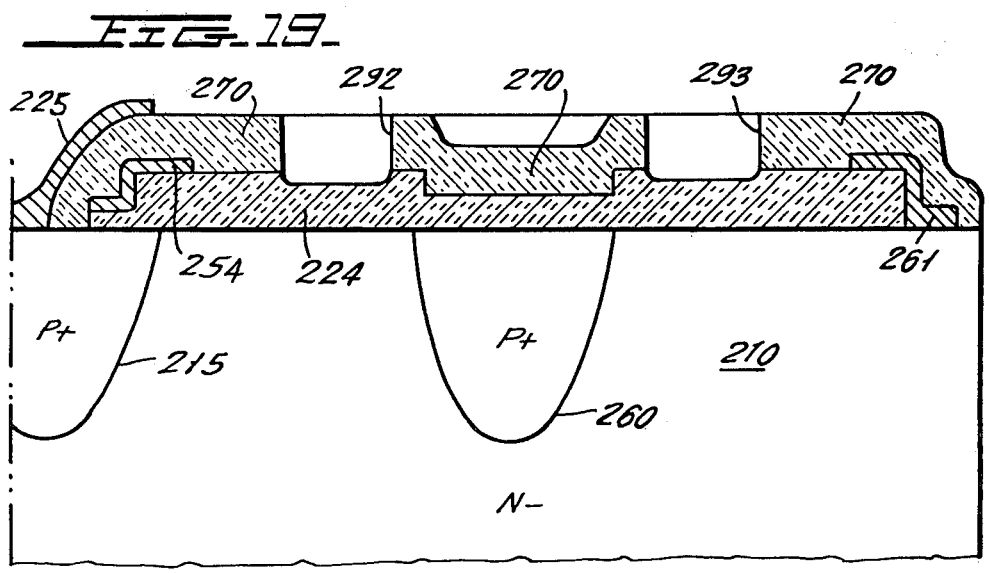

PLANAR STRUCTURE FOR HIGH VOLTAGE SEMICONDUCTOR DEVICES WITH GAPS IN GLASSY LAYER OVER HIGH FIELD REGIONS

RELATED APPLICATIONS

This application is related to the subject matter of copending applications Ser. No. 178,689, filed Aug. 18, 1980, in the name of Alexander Lidow et al, entitled PROCESS FOR MANUFACTURE OF HIGH POWER MOSFET WITH LATERALLY DISTRIBUTED HIGH CARRIER DENSITY BENEATH THE GATE OXIDE; Ser. No. 207,124 filed Nov. 17, 1980 in the name of Thomas Herman et al, entitled COMPOSITE METAL AND POLYSILICON FIELD PLATE STRUCTURE FOR SEMICONDUCTOR DEVICES; Ser. No. 207,126 filed Nov. 17, 1980, in the name of Alexander Lidow, entitled FLOATING GUARD REGION ND PROCESS OF MANUFACTURE FOR SEMICONDUCTOR SWITCHING DEVICE USING SPACED MOS TRANSISTORS HAVING A COMMON DRAIN REGION; and Ser. No. 38,662, filed May 14, 1979 now abandoned, and its continuation application Ser. No. 243,544, filed Mar. 13, 1981, in the name of Alexander Lidow et al, entitled PLURAL POLYGON SOURCE PATTERN FOR MOSFET, all of which are assigned to the assignee of the present invention.

BACKGROUND OF THE INVENTION

This invention relates to high voltage planar semiconductor devices, and more specifically relates to a novel configuration for the silox layer to prevent polarization of the layer under the influence of high lateral electric fields across the surface of the device.

A popular glassy protective coating over the surface of a semiconductor device employs the use of silicon dioxide which is relatively heavily doped with phosphorus. This material has the desirable insulation characteristics of undoped silicon dioxide but also has the ability to reflow smoothly when heated to relatively low temperature, thereby to form an impervious glassy cover over the surface it covers.

Phosphorus-doped silicon oxide is hereinafter referred to as "silox". The silox may contain from about 2% by weight to about 10% by weight of phosphorus. The higher the concentration of the phosphorus in the silox, the more polarizable the material becomes.

When silox is used in an environment where high lateral electric fields are present as is the case in planar semiconductor devices, the highly speed silicon dioxide will polarize and tend to distort the field at the surface of the device and in the body of the device. Thus, in regions of critically high fields, the device is liable to fail as a result of added stress due to polarization of the silox in the area of high electric field stress.

BRIEF DESCRIPTION OF THE INVENTION

In accordance with the present invention, the glassy silox cover at the surface of a planar semiconductor device is removed at regions of very high fields. The gap regions may expose an insulation layer such as undoped silicon dioxide or a silicon dioxide which has relatively low phosphorus content, for example, less than about 2% by weight. The invention can be applied to any number of devices which produce high electric field stress in their bulk and at their surface during operation.

In a preferred embodiment of the invention, two elongated gaps spaced from one another and disposed perpendicularly to the electric field lines in the silox are formed in the upper silox coating, thus removing the silox from the regions of very high stress and reducing the ability of the silox to polarize because of the presence of the gaps. Clearly, a single gap could be used or more than two series-related gaps relative to the electric field could be used.

The invention can be applied to virtually any semiconductor device which employs a silox coating over a region of high electric field stress. By way of example, the invention is applicable to diodes having floating guard rings where the surface of the device is covered with a reflowed silox and the reflowed silox is cut away to form two gaps on opposite sides, respectively, of the guard ring. The invention can similarly be applied to regions adjacent the opposite sides of guard rings in any type device including MOSFETS, power transistors, TRIMOS devices and the like.

The invention can also be applied to interior regions of devices as where two electrodes at relatively high potential difference are positioned on the top of a device and are covered with silox. One or more gaps can advantageously be placed in this silox layer between the two electrodes to prevent polarization effects on the silox and to prevent the creation of excessive electric field stress on the surface of the device.

BRIEF DESCRIPTION OF THE DRAWINGS

FIG. 1 is a cross-sectional view of a typical planar diode employing a prior art type of guard ring which extends around its outer periphery to increase the reverse voltage capability of the device.

FIG. 2 shows a diode such as that of FIG. 1 where a field plate is employed to improve the reverse voltage characteristics of the device.

FIG. 3 shows a further prior art arrangement wherein the field plate metal of FIG. 2 is caused to step over a corresponding step in an underlying oxide in order to improve the field distribution at the surface of the device.

FIG. 4 is a top view of chip which contains a planar diode covered with a silox layer which is gapped in accordance with the disclosure herein.

FIG. 5 is a cross-sectional view of the chip of FIG. 4 at an initial stage in its manufacture.

FIG. 6 shows the chip of FIG. 5 at a further stage of manufacture, wherein a field plate metallizing surface is applied to the device.

FIG. 7 shows the chip of FIG. 6 after the formation of a reflowed silox layer.

FIG. 8 shows the wafer of FIG. 7 after two series gaps are etched in the silox layer.

FIG. 9 is a cross-sectional view of the device of FIG. 8 and is a cross-section of FIG. 4 taken across the section line 9—9 in FIG. 4 showing a completed chip after electrodes are metallized on the chip to form a combined field plate with multiple steps.

FIG. 10 is a top view of a second embodiment of the invention illustrating the invention as applied to a MOSFET device.

FIG. 11 is a cross-sectional view through a small section of the source regions of FIG. 10 to illustrate the configuration of the region junctions.

FIG. 12 is a top view of the device of FIGS. 10 and 11, illustrating the manner in which the gate fingers contact the polysilicon grid which defines a gate electrode.

FIG. 13 is an enlarged view of an edge region of the device of FIG. 10 and illustrates the manner in which gaps are formed in the silox overcoating.

FIG. 16 shows a prior art type of TRIMOS device which is a semiconductor switching device using spaced MOS transistors having a common drain region.

FIG. 18 is a cross-sectional view of FIG. 17 taken across the section line 18—18 in FIG. 17 and illustrates spaced gaps in the silox coating.

FIG. 19 is a cross-sectional view of FIG. 17 taken across the section line 19—19 and illustrates gaps in the silox layer at the outer periphery of the device on opposite sides of the guard ring.

DETAILED DESCRIPTION OF THE DRAWINGS

Figure 14:
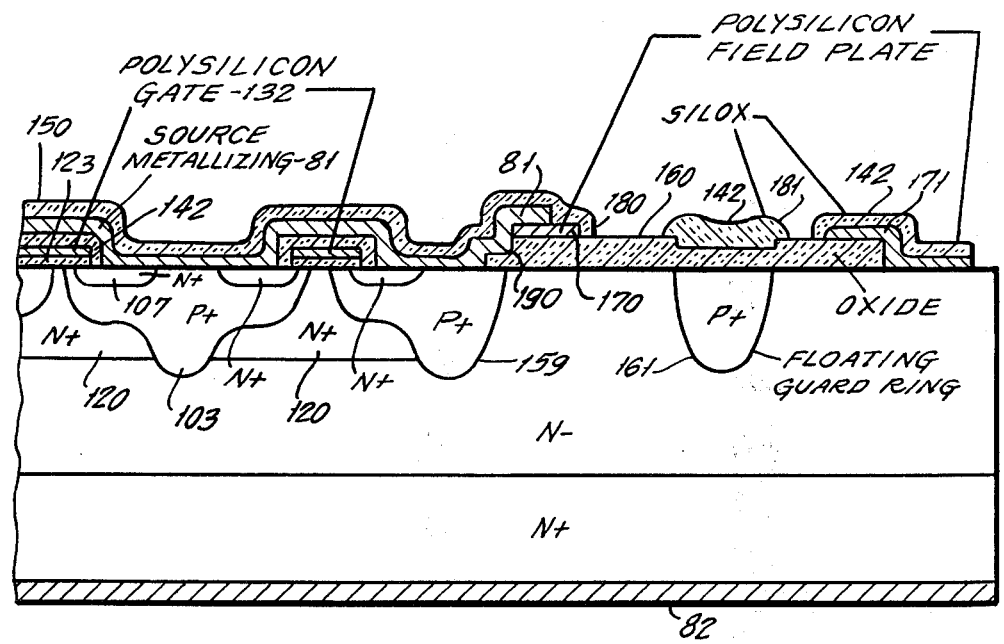
FIG. 14 is a cross-sectional view of FIG. 13 taken across the section line 14—14 and further illustates the silox gaps.

FIGS. 1, 2 and 3 show prior art arrangements which have been used for improving the reverse high voltage performance of planar semiconductor devices shown for the example of a diode in FIGS. 1, 2 and 3. As will be later described, one aspect of the novel invention, as shown in FIGS. 4 and 9, combines the features of FIGS. 1, 2 and 3 with a silox layer which has gaps to improve the high voltage performance of the ultimate device. The novel structure of FIGS. 4 and 9 will also be seen to incorporate a novel composite metal and polysilicon field plate structure which has the characteristics of the doubly stepped field plate shown in FIG. 3 without the processing complexity which is required for the device of FIG. 3.

Referring first to FIG. 1, there is shown a cross-section of a chip of semiconductor material 30 which can be monocrystalline silicon which could, for example, have a thickness of 14 mils and could have a rectangular configuration (or any other geometric shape) where the rectangle could be one having dimensions of 100 mils by 100 mils.

The device can be formed simultaneously with the processing of a large number of devices in a common wafer in the usual manner, where the devices are later separated from the wafer by conventional etching or other breakingaway techniques.

Similarly, in each of the embodiments of the invention to be described, all the devices can be made either on a single wafer or a plurality of devices can be formed in individual chips which are subsequently broken out of the wafer.

The wafer 30 of FIG. 1 can consist of monocrystalline silicon of the N conductivity type and can have an N-epitaxial layer deposited atop the N type body. All junctions are formed in the epitaxial layer in the usual manner. Note, however, that the invention can be carried out in a chip which does not use an epitaxial layer.

In FIG. 1, a planar diode is formed by a P+ layer 31 which may be diffused into the upper surface of the chip 30. At the same time the P+ layer 31 is diffused, a P+ ring 32 is formed around the outer periphery of the upper surface of the device to serve as a conventional guard ring. Upper and lower electrodes 33 and 34, which can be of any desired material, can be secured to the chip in the usual manner. Contact metals may be placed on electrodes 33 and 34, if necessary, so that the device can be easily assembled into a suitable casing. Note that while the embodiments herein are described using an N-type substrate which receives P type diffusions, the initial body could have been of the P type and the diffusion impurities could have been of the N type.

The guard ring 32 is well known and serves to improve the reverse voltage capability of the device by causing the electric field lines produced beneath the P+ region 31 during reverse bias to extend laterally outwardly and reduce the sharpness of curvature of field lines within the bulk of the chip. The P+ guard ring 32 also tends to spread out the electric field lines to reduce local electric field stress along the upper surface of the device.

A plurality of spaced guard rings, such as guard ring 32, have also been used to improve the redistribution of the electric field in the silicon body during reverse bias.

A field plate will also tend to reduce the electric field in the silicon body during reverse bias. A typical diode employing a field plate is shown in FIG. 2. In FIG. 2, the device is basically similar to the one of FIG. 1 except that, in place of the guard ring 32, the upper metallizing 40, which can be metal such as aluminum, a doped polysilicon, or a metal silicide, overlaps a silicon dioxide ring 41 or a ring of other insulation material. The enlarged area of contact 40 forces the electric field lines within the body 30 and below P+ region 31 to spread out radially beyond the outer periphery of electrode 40, thus reducing the curvature of the electric field lines within the body of the device and improving the device characteristics under reverse bias.

The main function of the guard ring 32 in FIG. 1 and of the field plate 40 in FIG. 2 is to spread the depletion region as far out as possible during reverse bias. It is curvature in this depletion region which is primarily responsible for premature breakdown of the semiconductor device. The curvature of the electric field can be further minimized by the arrangement shown in FIG. 3 which is similar to FIG. 2 except the oxide 41 contains a step 42 therein which causes the metallizing 40 to have a corresponding and second step. An arrangement of this type is disclosed by F. Conti and M. Conti at pages 92 to 105 of SOLID-STATE ELECTRONICS, 1972, Volume 15.

By stepping the field plate over the two different thicknesses of oxide as in FIG. 3, the device will have increased ability to withstand breakdown voltage because of the minimized curvature in the electric field by the stepped field plate. The processing of the device of FIG. 3 to have a step in the oxide layer, however, is relatively complex. In accordance with an aspect of the present invention, the effect of a stepped field plate as shown in FIG. 3 is obtained by a novel combined composite metal and polysilicon field plate structure which further incorporates a guard ring. The assembly is then coated with silox which is slotted to minimize polarization effects in the silox from further distorting the electric field lines in the semiconductor body which underlies the silox.

A novel diode formed in accordance with the invention is shown in FIGS. 4 and 9. The processing steps leading to the device of FIGS. 4 and 9 are shown in FIGS. 5 to 8.

To process the device of FIGS. 4 and 9, individual chips of a common wafer are identically processed and may have dimensions of 100 mils by 100 mils. The chip may be an N type chip having a thickness of about 14 mils.

If desired, the chip can have an epitaxially formed upper layer which is lightly doped and will receive all junctions.

The first step in the process is the coating of the individual chips with an oxide coating 50 which may have a thickness of 1.3 microns.

Thereafter, and using photolithographic techniques, the oxide coating 50 in FIG. 4 has windows 51 and 52 formed therein, wherein the window 51 is a groove enclosing the outer periphery of the device. The chip is then placed in an appropriate diffusion furnace and any suitable impurity, such as boron, is diffused into the windows at a suitable temperature and for a suitable time to define a central P+ region 53 surrounded by a P+ guard ring 54. The temperature and time selected for the process will be determined by the desired depth and concentration of the P+ diffusion selected by the designer. Note that in this embodiment and in all subsequent embodiments, the conductivity type selected for the devices can be reversed and in FIG. 5 the wafer 30 could have been a P+ body type wafer the diffusions could have been N type phosphorus diffusions.

After the formation of the P+ regions 53 and 54 in FIG. 5, the wafer or chip is coated with polysilicon which is degeneratively doped to be very conductive. The polysilicon layer 60 is formed to a thickness, for example, of 0.5 micron.

Note that a shell of polysilicon material 60 overlies the oxide ring 50 in the manner of the field plate of FIG. 2. Thereafter, a second mask is applied to the device and, through the use of suitable photolithographic techniques, an annular window 61 is etched in the polysilicon layer 60 to define a central region which contacts the P+ region 53 and an outer guard ring region 62 which encircles the periphery of the device.

The next step in the process is shown in FIG. 7 and is the deposition of a layer 65 of phosphorus-doped silicon dioxide or silox, where the phosphorus can, for example, be 8% by weight of the silicon dioxide. The phosphorus doped silicon dioxide layer 65 is deposited to a thickness of 1.0 micron. The wafer is thereafter placed in a furnace and heated, for example, to a temperature of 900° C. for 60 minutes so that the silox reflows and forms a smooth glassy cover over the entire upper surface of the device.

Thereafter, and as shown in FIG. 8, a further mask is applied to the device and, through the use of photolithographic techniques, two annular gaps 70 and 71 are formed in the silox coating 65 to a depth which exposes the underlying oxide 50.

Thereafter and as shown in FIG. 9, a contact plate, such as the aluminum contact plate 73, is deposited atop the polysilicon layer 60 and overlies the outer edge of the polysilicon layer 60. In FIG. 9, electrode 73 extends beyond the polysilicon 60 by a radial distance A. As an example, the polysilicon 60 can have a lateral dimension of 100 mils by 100 mils and can be overlapped by 2.0 mils, equal to the dimension A by the electrode 73.

The final device shown in FIGS. 4 and 9 can also be provided with metallizing 74 on its bottom surface (FIG. 9) to serve as a heat sink when the device is mounted in any suitable housing.

The device of FIGS. 4 and 9 has several advantages over prior art devices and can withstand higher reverse voltages than prior art devices.

It is first noted that the device combines the use of a floating P+ ring 54 of FIG. 1, with the overlapping field plate structure, including the field plate defined by the polysilicon layer 60 which overlies the oxide layer 50 as in FIG. 2. Moreover, the effective field plate structure of FIGS. 4 and 9 is electrically identical to that of FIG. 3 which required a step 42 in the oxide but is produced with a simpler manufacturing process. More specifically, in FIG. 9, the metallizing 73 overlies the edge of the polysilicon 60, thereby to define a composite metal and polysilicon field plate which controls the electric field within the silicon body 70 like the stepped electrode 40 of FIG. 3. Thus, the two electrodes 60 and 73 are electrically connected together in the central regions of the device, and the effect on electric fields within the device will be to reduce their curvature in the same manner as the continuous stepped metal electrode 40 of FIG. 3. Consequently, the novel composite polysilicon and metal electrode including the polysilicon layer 60 and electrode 73 are simply formed structures which are made using other steps necessary for the manufacturing process and minimize the curvature of electric fields beneath the electrode and in the silicon body.

A further important feature of this application is the provision of the gaps 70 and 71 in the silox layer 65. As was previously described, in order to make the silox such that it will reflow easily to form a good glassy sealing surface over the exposed surfaces of the device, phosphorus is added to the glass. The addition of phosphorus or other equivalent materials, however, renders the silox polarizable. Because it is polarizable, a high lateral field will cause polarization in the silox which can interfere with the distribution of the electric fields within the bulk of wafer 30 and at the surface of the wafer or chip 30. As a result, the high voltage performance of the device is degraded.

The gaps 70 and 71, particularly in the region of the guard ring 54, will act to minimize polarization effects at the relatively highly stressed regions such as the regions on opposite sides of the P+ region 54.

The novel arrangement described in connection with FIGS. 4 through 9 for the diode, including the composite field plate structure and the provision of gaps in the silox layer adjacent highly stressed regions of the device, can be used in virtually any type of high voltage planar semiconductor device.

FIGS. 10 through 15 illustrate the application of the invention to a MOSFET device of the general type set forth in copending application Ser. No. 178,689. Copending application Ser. No. 178,689 discloses a detailed process for the manufacture of a high power MOSFET device and those details of manufacture can be used in making the device of FIGS. 11 through 15. The subject matter of the said application is incorporated herein by reference.

The chip defining the device is shown in plan view in FIG. 10 and can be a chip having dimensions, for example, of 100 mils by 100 mils, with the wafer thickness as shown in FIGS. 11 and 14 of about 14 mils. The wafer used to manufacture the high power MOSFET of FIGS. 10 and 11 is preferably one of N type material having an N-epitaxially deposited layer 80 having a thickness of 35 microns.

As seen in FIG. 10, the device consists of an overlying source electrode 81 which can consist of an aluminum sheet which will be later seen to be connected to a plurality, for example, 6000 hexagonal MOSFET cells. Each of the source cells (a few are shown in enlarged view in FIG. 10 and in FIG. 13) passes current through respective channels to be described to a common bottom drain electrode 82 (FIGS. 11 and 14).

A main gate electrode 93 is provided which has a plurality of radiating fingers, such as the fingers 84 to 91 (FIG. 10) which are connected to a polysilicon gate grid 92 (FIG. 12) which overlies a gate oxide which controls pairs of underlying channels. Electrical connection to the gate electrode is made at the enlarged gate pad 93. Similarly, connection to the source electrode 91 is made at the source connection pad 94.

Typical cells are best seen in FIG. 11 and consist of respective hexagonally shaped P type diffusions 100 to 103 which P type diffusions can respectively have diameters of about 1 mil. The particular shape of the P type diffusions is described in detail in copending applications Ser. No. 178,689 and Ser. No. 243,544.

Each of the P type regions 100 through 103, which are hexagonal in configuration, contain respective hexagonal N+ channels such as the channels 104, 105, 106 and 107, respectively, which are the source regions for each of the cells. Each of the cells 100 through 103 is embedded in a shallow N+ region 120 which has a depth, for example, of about 1 micron. The thin hexagonal region disposed between the outer periphery of source regions 104 through 107 and the N+ region 120 surrounding them define respective channels which can be inverted by application of a suitable gate voltage atop the gate oxide above these channels.

Thus, as shown in FIG. 11, a hexagonal grid of silicon dioxide including legs 121, 122 and 123 in FIG. 11 overlie the channels defined in two opposing legs of opposing hexes as shown. The oxide grid including the legs 121, 122 and 123 then has corresponding segments of the polysilicon gate grid 92 of FIG. 12 overlying the oxide. Thus, in FIG. 11, polysilicon legs 130, 131 and 132 of grid 92 of FIG. 12 overlie the respective oxide legs 121, 122 and 123.

Electrical contact is made between the gate electrode fingers and the polysilicon gate grid in the manner shown in FIG. 12 where the gate contact finger directly overlies and contacts the polysilicon gate grid. Note that the contact fingers of the gate electrode will be suitably insulated from the adjacent source electrode 81 by appropriate spacing and by appropriate oxide insulation.

As further shown in FIG. 11, the polysilicon gate grid is covered by an oxide layer including oxide sections 140, 141 and 142 over the polysilicon grid sections 130, 131 and 132, respectively. These are in turn covered by a reflowed silox layer having a relatively high phosphorus concentration, and which includes sections 143, 144 and 145. Note that the silox and oxide layers just described are removed at areas where contact is to be made between the gate contact finger and the polysilicon gate grid.

The silox is then covered directly by the source metallizing 81 and by a further silox layer 150 which is not reflowed and has a relatively low phosphorus concentration.

FIG. 14 illustrates the pattern of the device at its edge and shows the last P+ element 103 of FIG. 11 at the left-hand end of FIG. 14. The last cell portion in the string is the half-cell portion 159 (see FIG. 13) through which the section is taken. The edge of the device contains a silicon dioxide layer 160 which overlies a P+ floating guard ring 161 in a manner reminiscent of that of FIGS. 4 and 9.

The outer periphery of the device contains a polysilicon field plate 170 which encircles the periphery and assists in terminating the source metallizing 81 which overlies field plate 70. The outer periphery also includes an outermost polysilicon field plate 171 which overlies the outer edge of the silicon dioxide layer 160 and makes contact with the substrate 80 and thus is connected to the drain 82.

In the device shown best in FIG. 14, there is a high electric field produced at the outer periphery of the device during reverse-voltage conditions. The curvature of this field is minimized by the floating guard ring 161 and by the use of the polysilicon field plates 170 and 171. The field produced in the highly doped silox layer 142 could cause the silox to polarize and thus interfere with the electric field distribution pattern.

In accordance with an important aspect of the invention, the highly doped silox layer 142, which may be simultaneously deposited with layer 150, is provided with two annular gaps, such as the gaps 180 and 181, thereby to expose the surface of silicon dioxide layer 160 which is not subject to polarization effects.

Figure 15:
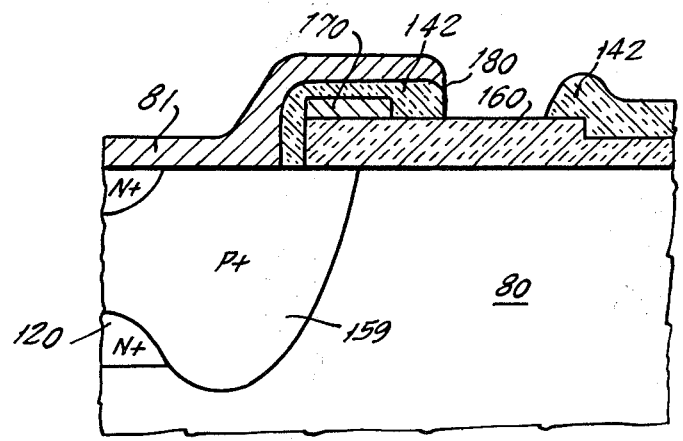
FIG. 15 is an enlarged view of a second embodiment of the field plate of FIG. 14.

The novel composite polysilicon and metallizing field plate can also be used in the MOSFET device of FIGS. 11 to 14 as is best shown in FIG. 15. Thus, in FIG. 15, there is disclosed a modification of the arrangement shown in FIG. 14 for terminating the source metallizing 81.

Referring to FIG. 15, where components similar to those of FIG. 14 have the same identifying numerals, the polysilicon field plate 170 can be covered with an extension of the silox 142 as illustrated. The metallizing 81 can then extend over the silox covering 142 as illustrated, thereby to define an effective field plate step which will minimize the curvature of the electric field in the silicon body 80 without relying on a step such as the step 190 in the oxide 160 in FIG. 14 to obtain this result.

FIGS. 16 through 19 illustrate a still further embodiment of the invention as applied to a TRIMOS type device. A TRIMOS type device is a semiconductor switching device using spaced MOS transistors having a commond drain region. The device is described in U.S. Pat. No. 4,199,774 in the name of James B. Plummer, entitled MONOLITHIC SEMICONDUCTOR SWITCHING DEVICE.

Referring to FIG. 16, the prior art TRIMOS device consists of a substrate region 210 which is of lightly doped N-epitaxially deposited silicon. The lightly doped substrate 210 contains two D-MOS type transistors 212 and 213 which consist of P+ regions 214 and 215, respectively; N+ regions 216 and 217 which are wholly enclosed within the P+ regions 214 and 215, respectively; and a high conductivity N+ type region 218 which is disposed between the two transistors 212 and 213. Regions 214 and 216 define a first conduction channel 220 and regions 215 and 217 define a second conduction channel 221. Channels 220 and 221 can be inverted by the common gate electrode 222 which has a terminal 223 and which is spaced from the upper substrate 210 by the silicon dioxide layer 224. Any suitable insulation layer can be used.

A first main electrode 225, having terminal 226, is then connected to the P+ region 214 and N+ region 216. Electrode 225 may be considered either the source or drain electrode of the transistor 212. The other electrode consists of the body of the substrate 210 disposed between transistors 212 and 213.

Transistor 213 has a main electrode 227 which has a terminal 228. Electrode 227 is connected to the P+ region 215 and the N+ region 217. The N+ regions 216 and 217 define, for example, the source regions of each of transistors 212 and 213. The drain region of each of transistors 212 and 213 is that region of the substrate 210 which is disposed between the channels 220 and 221.

The N+ region 218 is disposed between the channels 220 and 221 and beneath the gate 222. The N-substrate could be inverted when suitable voltages are connected to the gate electrode 222. By making the region 218 relatively highly conductive, the region will not be inverted by gate 222.

The operation of the device of FIG. 16 is given in detail in the above-noted U.S. Pat. No. 4,199,774. Briefly stated, for gate potentials above the threshold value, there will be three distinct regions of operation. In the low level region, and if the terminal 228 is less than about 1.5 volts above the potential of terminal 226, both channels 220 and 221 will be inverted and both transistors 212 and 213 will operate in their linear regions. Thus, all anode-to-cathode current will be carried by electrons at the surface of the device. This device will then exhibit low on-resistance current-voltage characteristics similar to that of two short channel D-MOS transistors in series. By way of example, the channel length for channels 220 and 221 may be about 2.5 microns for each.

In an intermediate level of operation, and with an increasing voltage on the terminal 228, the junction between region 215 and substrate 210 becomes forward-biased and serves as the emitter of a wide base PNP lateral transistor. The junction-injected holes will drift and diffuse to the P+ region 214 where they will be collected to contribute an added component to the device current. The result is an increase in transconductance.

As the PNP transistor collector current increases with anode or gate potential, its flow through the resistive region within and extending along P+ region 214 raises the potential of the P+ region beneath the gate 222 and the channel 220 begins to turn on the vertical NPN transistor consisting of regions 216, 214 and 210 which is inherent in the D-MOS structure. This NPN device and the PNP device form a four-layer diode which regeneratively switches when the alphas of the PNP and NPN transistors add up to one. In its on-state then, the TRIMOS device exhibits a dynamic resistance, for example, of less than about 10 ohms and can pass currents of several amperes.

Disadvantages of the device of FIG. 16 include limited reverse voltage withstand capability and the difficulty of manufacturing the device. The reverse voltage limitation is caused by the electric field which expands from P+ region 214 and terminates sharply on the surface of substrate 210 adjacent the beginning of the N+ region 218. Thus, the device tends to break down at about 200 volts reverse voltage.

The device is also hard to make because the N+ region 218 must be formed by a diffusion step and a mask alignment step which are independent of the self-aligned manufacturing techniques used for making the transistors 212 and 213.

A further drawback with the device is that when silox is used to form a glassy covering over the upper surface of the device, the silox would polarize adjacent regions of high lateral stress and thus reduces the maximum reverse voltage of the device.

Figure 17:
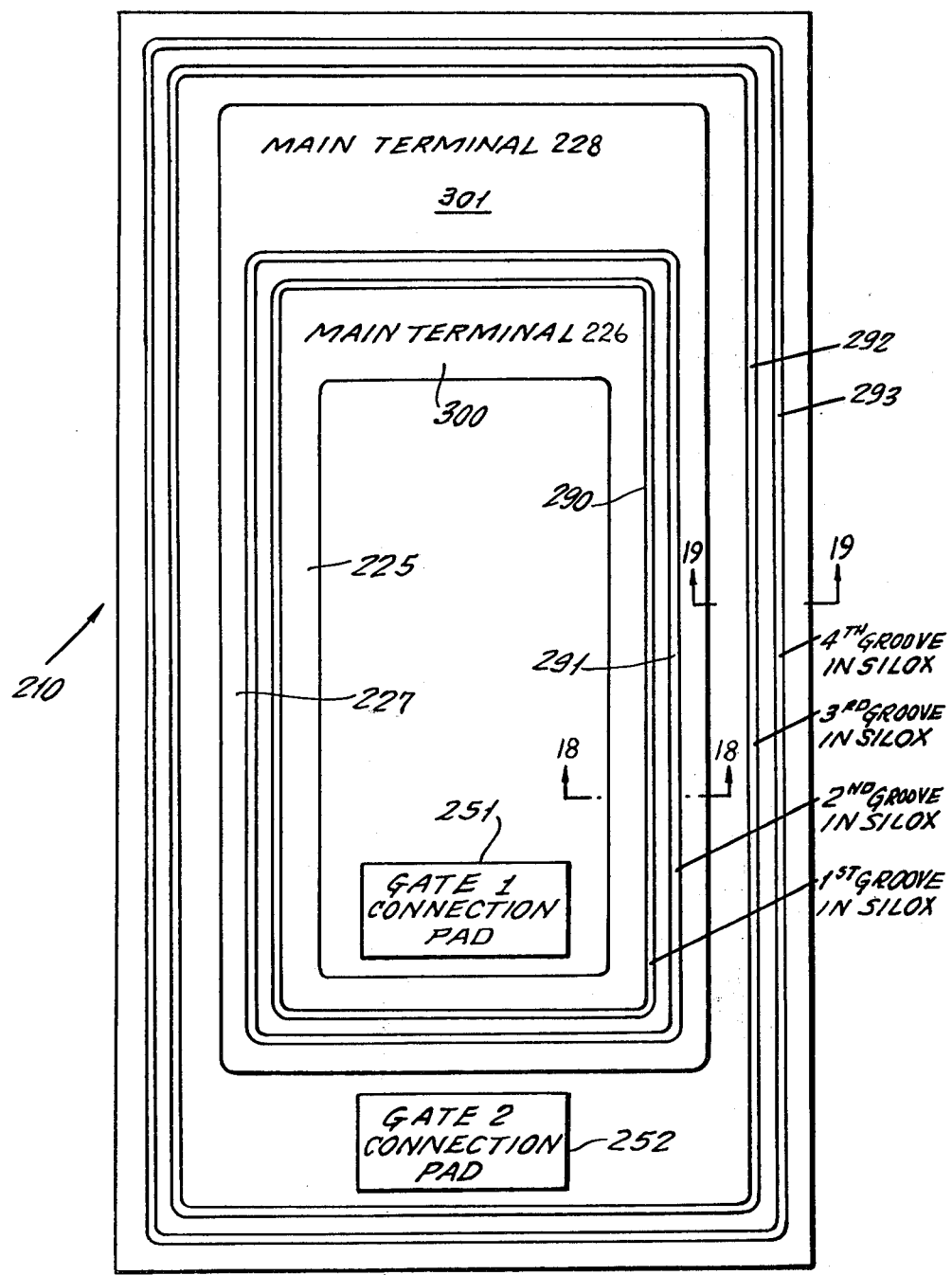
FIG. 17 is a top view of a TRIMOS device which incorporates the feature of the present invention.

As disclosed in copending application Ser. No. 207,126, referred to above, and as shown in FIGS. 17 and 18, it was found that the centrally located N+ region 218, which was thought to be necessary to prevent inversion of the N-substrate 210, caused increased electric field near the surface of the device. Moreover, the device required an additional diffusion and masking step in the manufacturing process.

In accordance with the above application Ser. No. 207,126 the N+ region 218 is replaced by a floating P+ region 250 which can be formed simultaneously with the formation of the P+ regions 214 and 215. Thus, no additional process steps are necessary for the formation of the central region 250 shown in FIG. 18. Moreover, and in accordance with the invention, the novel concept of the cut in the phosphorus-doped silicon oxide to minimize polarization of this layer and the use of a composite field plate are incorporated in the construction of the TRIMOS device.

Main terminals 226 and 228 are clearly shown in FIG. 17 where the TRIMOS configuration is an elongated ring-shaped configuration, with the region 250 extending in the middle of the section and of the ring-shaped configuration of FIG. 17, as will later be more fully described.

A suitable processing system similar to that, for example, disclosed in copending application Ser. No. 178,689 can be used to form the device, whereby the oxide layer 224 receives thereon polysilicon gate sections 251 and 252 which are skewed as shown to have a relatively close spacing to the underlying channels 220 and 221, respectively, and a greater spacing from the surface where they are removed from the channels. At the time the polysilicon gates 251 and 252 are formed, polysilicon field plates 253 and 254 are also formed. The polysilicon field plates 253 and 254 are shown as stepped members to obtain the benefit of minimizing the curvature of electric field within the body 210 of the chip and to increase the spacing of equipotential lines at the surface of the chip.

Note in FIG. 19, which is a cross-sectional view of the outer periphery of the chip, that there is also provided a P+ guard ring 260 which encircles the outer periphery of the chip in the manner of guard ring 161 in FIG. 14 and guard ring 54 in FIG. 9. The outermost periphery of the upper surface of the oxide layer 224 then receives a polysilicon field plate 261 which is connected to the N-substrate 210.

In making the device of FIGS. 17, 18 and 19, it is desirable to coat the upper surface of the device with a silox layer 270. The silox layer is a relatively heavily phosphorus-doped silicon dioxide layer formed over the full surface of the device. As previously discussed, however, this silox layer is polarizable by high lateral electric fields which can interfere with the field distribution within the body of device 210. Thus, in accordance with the invention, first and second ring-shaped cuts 290 and 291 are made through the silox layer and down to the underlying oxide 224 in FIGS. 17 and 18 and on opposite sides of the P+ ring 250. Thus, high voltage, which may appear on either side of the P+ ring 250, will have reduced polarization effects on the silox and thus will cause relatively little effect on the electric field distribution at this area.

In a similar manner, third and fourth cuts 292 and 293, respectively (FIGS. 17 and 19), are made in the silox at the outer periphery of the device and on opposite sides of the guard ring 260. These cuts have the same effect on the polarization of the silox layer as the cuts which have been described previously.

It will also be noted that the arrangement of FIG. 18 employs the benefit of the novel composite plate by virtue of the overlapping relationship between polysilicon gates 251 and 252 and the metallizing 225 and 227, respectively. That is to say, these components define a stepped electrode insofar as the electric field beneath the stepped electrode is concerned. If desired, the metal electrode 225 in FIG. 19 could more completely overlap the silox layer 270 and the field plate 252 to take full advantage of the benefit of the composite polysilicon field plate and metallizing as has been previously described.

In the arrangement shown in FIG. 17, the chip is a rectangular chip which could, for example, have dimensions of 100 mils by 150 mils. It will be observed that main terminal 226 has an enlarged region 300 which can serve as a connection region, while terminal 228 similarly has an enlarged region 301 for connection purposes. Similarly, the gates 251 and 252, which are connected internally of the device in a manner not disclosed in FIG. 17, can be provided with the gate connection pads 251 and 252, respectively, shown in FIG. 17 and located on the surfaces of the chip as shown.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is:

1. A high voltage semiconductor device comprising a chip of semiconductor material; at least one P-N junction formed in at least one surface of said chip; electrode means connected to at least a selected area of said surface whereby, upon application of a reverse-biasing voltage to said electrode means, an electric field is produced in said chip of semiconductor material; a thin glassy layer of insulation material overlying and sealing at least portions of said one surface of said chip; a second insulation layer of material which is not subject to polarization effects disposed between said glassy layer and said first surface of said chip; said glassy layer being polarizable by electric fields having at least a component parallel to said thin glassy layer; and first and second coextensive spaced elongated gaps in said glassy layer to reduce polarization effects therein and to reduce the adverse influence of polarization adjacent said gaps on the electric field within said chip under reverse-bias conditions; a guard ring formed in said first surface of said chip closely adjacent to but spaced from the outer periphery of said chip; said guard ring having a conductivity type opposite to that of the chip in which said guard ring is formed; said first and second gaps being located above and extending along opposite sides respectively of said guard ring.

2. The device of claim 1 wherein said second insulation layer is silicon dioxide.

3. The device of claim 1 wherein said glassy layer consists of a reflowed layer of silicon dioxide containing sufficient phosphorus-like material to enable reflow of the glassy layer.

4. The device of claim 3 wherein said reflowed layer contains from about 2% to about 10% by weight of phosphorus therein.

5. The device of claim 1 wherein said electrode means has a portion thereof which extends atop said second insulation layer and over said junction where said junction terminates on said one surface to define a field plate.

6. The device of claim 1 wherein said device is a diode.

7. The device of claim 1 wherein said device is a power field effect transistor.

8. A high voltage semiconductor device comprising a thin body of monocrystalline silicon having first and second parallel surfaces; at least one planar P-N junction formed in said first surface and terminating on said first surface; a first insulation layer extending across said P-N junction, an electrode connected to at least one portion of said first surface, a glassy layer of insulation material extending over and sealing at least portions of said electrode and said insulation layer; said glassy insulation material being substantially more polarizable than silicon dioxide and being substantially more polarizable than said first insulation layer; at least a selected portion of said body being subject to a high electric field during operation of said device; said glassy layer having a gap therein extending to said first insulation layer at regions adjacent said selected portion of said body to reduce the effect on said electric field at said selected portion due to polarization of said glassy layer; said insulation layer remaining intact beneath said gap in said glassy layer.

9. The device of claim 8 wherein said glassy layer is reflowed silox and wherein said gap is a first thin elongated gap.

10. The device or claim 9 wherein said silox layer has a second gap extending parallel to sand coextensively with said first gap.

11. The device of claim 10 which further includes a guard ring formed in said first surface of said chip closely adjacent to but spaced from the outer periphery of said chip; said guard ring having a conductivity type opposite to that of the chip in which said guard ring is formed; said first and second gaps being located above and extending along opposite sides respectively of said guard ring.

12. The device of claim 11 wherein said second insulation layer is silicon dioxide.

13. The device of claim 12 wherein said electrode means has a portion thereof which extends atop said second insulation layer and over said junction where said junction terminates on said one surface to define a field plate.

14. The device of claim 13 wherein said device is a diode.

15. The device of claim 13 wherein said device is a power field effect transistor.

* * * * *